(12) United States Patent
Yang

(10) Patent No.: US 12,543,313 B2
(45) Date of Patent: Feb. 3, 2026

(54) SEMICONDUCTOR STRUCTURE AND ITS FABRICATION METHOD, MEMORY AND MEMORY SYSTEM

(71) Applicant: Yangtze Memory Technologies Co., Ltd., Hubei (CN)

(72) Inventor: Yonggang Yang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 456 days.

(21) Appl. No.: 18/091,146

(22) Filed: Dec. 29, 2022

(65) Prior Publication Data

US 2024/0164098 A1    May 16, 2024

(30) Foreign Application Priority Data

Nov. 15, 2022   (CN) .......................... 202211429199.0

(51) Int. Cl.
| | |
|---|---|
| *H10B 43/27* | (2023.01) |
| *H10B 41/27* | (2023.01) |
| *H10B 41/35* | (2023.01) |
| *H10B 41/40* | (2023.01) |
| *H10B 43/35* | (2023.01) |
| *H10B 43/40* | (2023.01) |

(52) U.S. Cl.
CPC ............. *H10B 43/27* (2023.02); *H10B 41/27* (2023.02); *H10B 41/35* (2023.02); *H10B 41/40* (2023.02); *H10B 43/35* (2023.02); *H10B 43/40* (2023.02)

(58) Field of Classification Search
CPC ........ H10B 43/27; H10B 43/35; H10B 41/35; H10B 41/40; H10B 43/40; H10B 41/27
See application file for complete search history.

(56) References Cited

U.S. PATENT DOCUMENTS

| | | | |
|---|---|---|---|
| 2020/0098772 A1* | 3/2020 | Wang ................ | H01L 21/32134 |
| 2021/0118901 A1* | 4/2021 | Yang ................... | H10D 84/016 |
| 2023/0282281 A1* | 9/2023 | Wang ................... | H10B 41/10 |
| | | | 257/314 |

* cited by examiner

*Primary Examiner* — Richard A Booth
(74) *Attorney, Agent, or Firm* — Oblon, McClelland, Maier & Neustadt, L.L.P.

(57) ABSTRACT

A fabrication method of a semiconductor structure includes forming a stack structure and a memory channel structure on a substrate. The memory channel structure penetrates through the stack structure along a stack direction and extends into the substrate to form an extension part. The memory channel structure includes a memory function layer and a channel layer. The method further includes removing the substrate and exposing the extension part, and forming a sacrificial layer on a side of the stack structure where the substrate is removed from. The sacrificial layer wraps a part of the exposed extension part. The method also includes removing the memory function layer in the unwrapped extension part and exposing the corresponding channel layer, removing the sacrificial layer, exposing the remaining memory function layer in the extension part, and forming a semiconductor layer on a side of the stack structure where the sacrificial layer is removed from.

4 Claims, 7 Drawing Sheets

SEMICONDUCTOR STRUCTURE AND ITS FABRICATION METHOD, MEMORY AND MEMORY SYSTEM

CROSS REFERENCE OF RELATED APPLICATIONS

The present application claims the benefit of priority to China Application No. 202211429199.0, "Semiconductor structure and its fabrication method, memory and memory system", file on Nov. 15, 2022, the content of which is incorporated herein by reference in its entirety.

TECHNICAL FIELD

The present disclosure relates to the field of semiconductor technologies, in particular to a semiconductor structure, a fabrication method thereof, a memory, and a memory system.

BACKGROUND

A three-dimensional memory (3D NAND) is a new type of memory, which vertically stacks multi-layer memory cells. Based on this technology, a memory device with a memory capacity several times higher than that of similar NAND technologies can be created. This technology can support to provide higher memory capacity in smaller space, which brings great cost savings, energy consumption reduction and significant performance improvement.

However, with the increasing number of stack layers, the memory channel structure is prone to local collapse or bending when a part of the memory function layers in the memory channel structure is removed.

SUMMARY

The present disclosure aims to provide a semiconductor structure and its fabrication method, memory, and memory system, which can avoid local collapse or bending of the memory channel structure when removing the memory function layer.

The implementation of the present disclosure provide a fabrication method of a semiconductor structure. The fabrication method includes:

forming a stack structure and a memory channel structure on a substrate, wherein the stack structure includes a gate structure and a gate spacer layer arranged alternately, the memory channel structure penetrates through the stack structure along a stack direction and extends into the substrate to form an extension part, and the memory channel structure includes a memory function layer and a channel layer;

removing the substrate and exposing the extension part;

forming a sacrificial layer on a side of the stack structure where the substrate is removed from, the sacrificial layer wrapping a part of the exposed extension part;

removing the memory function layer in the unwrapped extension part and exposing the corresponding channel layer;

removing the sacrificial layer and exposing the remaining memory function layer in the extension part; and forming a semiconductor layer on a side of the stack structure where the sacrificial layer is removed from, the semiconductor layer wrapping the channel layer and the memory function layer exposed in the extension part.

The implementations of the present disclosure further provide a semiconductor structure including:

a stack structure including a gate structure and a gate spacer layer arranged alternately;

a memory channel structure penetrating through the stack structure along a stack direction and protruding out of the stack structure to form an extension part, the memory channel structure including a memory function layer and a channel layer; and a semiconductor layer which is on a side of the stack structure close to the extension part and wraps an end face of the extension part, and a side of the memory function layer and a side of the channel layer in the extension part.

The implementations of the present disclosure further provide a memory. The memory includes the semiconductor structure according to any one of the above implementations and a peripheral circuit structure. The peripheral circuit structure is bonded with the stack structure on a side of the stack structure away from the semiconductor layer, so that the peripheral circuit structure is electrically connected with the semiconductor structure.

The implementations of the present disclosure further provide a memory system. The memory system includes at least one memory as described above and a controller coupled with the memory, and the controller is used to control the memory to store data.

For the semiconductor structure, its fabrication method, the memory and the memory system provided by the implementations of the present disclosure, the phenomenon of the local collapse or bending of the memory channel structure can be avoided when the memory function layer is removed, and the thickness of the bottom selection gate spacer layer can be protected without arranging a stop layer, by: forming a stack structure and a memory channel stricture on the substrate, wherein the memory channel structure penetrates through the stack structure along the stack direction and extends into the substrate to form an extension part, and the memory channel structure includes a memory function layer and a channel layer; then, removing the substrate and exposing the extension part, and forming a sacrificial layer on a side of the stack structure where the substrate is removed from, wherein the sacrificial layer wraps a part of the exposed extension part; then, removing the memory function layer in the unwrapped extension part and exposing the corresponding channel layer; then, removing the sacrificial layer and exposing the remaining memory function layer in the extension part; and then, forming a semiconductor layer on a side of the stack structure where the sacrificial layer is removed from, wherein the semiconductor layer wraps the channel layer and the memory function layer exposed in the extension part.

BRIEF DESCRIPTION OF THE DRAWINGS

In order to more clearly explain the technical solutions in the implementations of the present disclosure, the following will briefly introduce the accompanying drawings used in the description of the implementations. It is obvious that the accompanying drawings described in the following are only some implementations of the present disclosure. For those skilled in the art, other accompanying drawings can be obtained according to these accompanying drawings without making inventive work.

FIG. 2g' is another cross-sectional structural schematic diagram of a semiconductor structure provided by an implementation of the present disclosure;

DETAILED DESCRIPTION

Figure 1:
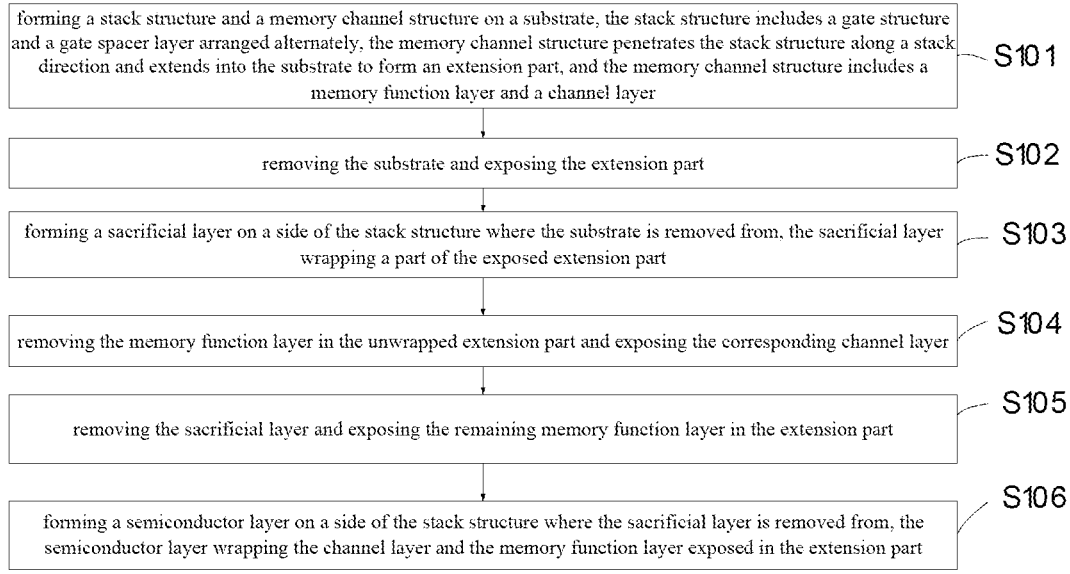
FIG. 1 is a flow schematic diagram of a fabrication method of a semiconductor structure provided by an implementation of the present disclosure.

The present disclosure is further described in detail below in combination with the accompanying drawings and implementations. In particular, the following implementations are only used to explain the present disclosure, but do not limit the scope of the present disclosure. Similarly, the following implementations are only some but not all of the implementations of the present disclosure. All other implementations obtained by those skilled in the art without inventive work fall within the scope of protection of the present disclosure.

In the description herein, it should be understood that the orientation or position relationship indicated by the terms "center", "lateral", "up", "down", "left", "right", "vertical", "horizontal", "top", "bottom", "inside", "outside" and so on is based on the orientation or position relationship shown in the accompanying drawings, only for the convenience of describing the present disclosure and simplifying the description, instead of indicating or implying that the indicated device or element must have a specific orientation, be constructed and operate in a specific orientation, and thus it cannot be understood as a limitation to the present disclosure. In addition, the terms "first" and "second" are only used for descriptive purposes and cannot be understood as indicating or implying relative importance or implicitly indicating the number of indicated technical features. Thus, the features defined as "first" and "second" may explicitly or implicitly include one or more of the features.

In the description herein, it should be noted that unless otherwise specified and limited definitely, the terms "installation", "interface" and "connection" should be understood in a broad sense, for example, it can be fixed connection, removable connection or integrated connection, or it can be mechanical connection or electrical connection, or it can be directly connection or indirectly connection through an intermediate medium, or it can be the internal connection between two elements. For those skilled in the art, the specific meaning of the above terms in the present disclosure can be understood according to the specific circumstances.

It is understandable that the meanings of "on", "over" and "above" in the description herein should be interpreted in the widest way, so that "on" not only means "on" something without intermediate features or layers (i.e., directly on something), but also includes the meaning of "on" something with intermediate features or layers.

The terms used herein are only for the purpose of describing specific implementations and are not intended to limit implementations. Unless the context expressly indicates, otherwise the singular forms "a" and "an" used herein are also intended to include the plural forms. "Multiple" means two or more. It should also be understood that the terms "comprise" and/or "include" as used herein specify the presence of the stated features, integers, steps, operations, units and/or components, without excluding the presence or addition of one or more other features, integers, steps, operations, units, components and/or combinations thereof.

The implementations of the present disclosure provide a semiconductor structure, a fabrication method thereof, a memory, and a memory system.

FIG. 1 is the flow schematic diagram of a fabrication method of a semiconductor structure provided by an implementation of the present disclosure. The fabrication method of the semiconductor structure can include the following steps S101-S106.

Step S101: forming a stack structure and a memory channel structure on a substrate, wherein the stack structure includes a gate structure and a gate spacer layer arranged alternately, the memory channel structure penetrates through the stack structure along the stack direction and extends into the substrate to form an extension part, and the memory channel structure includes a memory function layer and a channel layer;

Step S102: removing the substrate and exposing the extension part;

Step S103: forming a sacrificial layer on a side of the stack structure where the substrate is removed from, the sacrificial layer wrapping a part of the exposed extension part;

Step S104: removing the memory function layer in the unwrapped extension part and exposing the corresponding channel layer;

Step S105: removing the sacrificial layer and exposing the remaining memory function layer in the extension part;

Step S106: forming a semiconductor layer on a side of the stack structure where the sacrificial layer is removed from, the semiconductor layer wrapping the channel layer and memory function layer exposed in the extension part.

It should be understood that the steps shown in the above fabrication method are not exclusive, and other steps can be performed before, after, or between any of the steps shown.

Referring to FIGS. 2a to 2h, FIGS. 2a to 2h are cross-sectional structural schematic diagrams of a semiconductor structure 10 provided by an implementation of the present disclosure under different process steps. The above steps S101-S106 will be further described below in combination with FIGS. 2a to 2h.

Step S101: Forming a stack structure 12 and a memory channel structure 13 on the substrate 11. The stack structure 12 includes a gate structure 121 and a gate spacer layer 122 alternately arranged. The memory channel structure 13 penetrates through the stack structure 12 along the stack direction and extends into the substrate 11 to form an extension part Q. The memory channel structure 13 includes a memory function layer 131 and a channel layer 132.

Figure 2A:
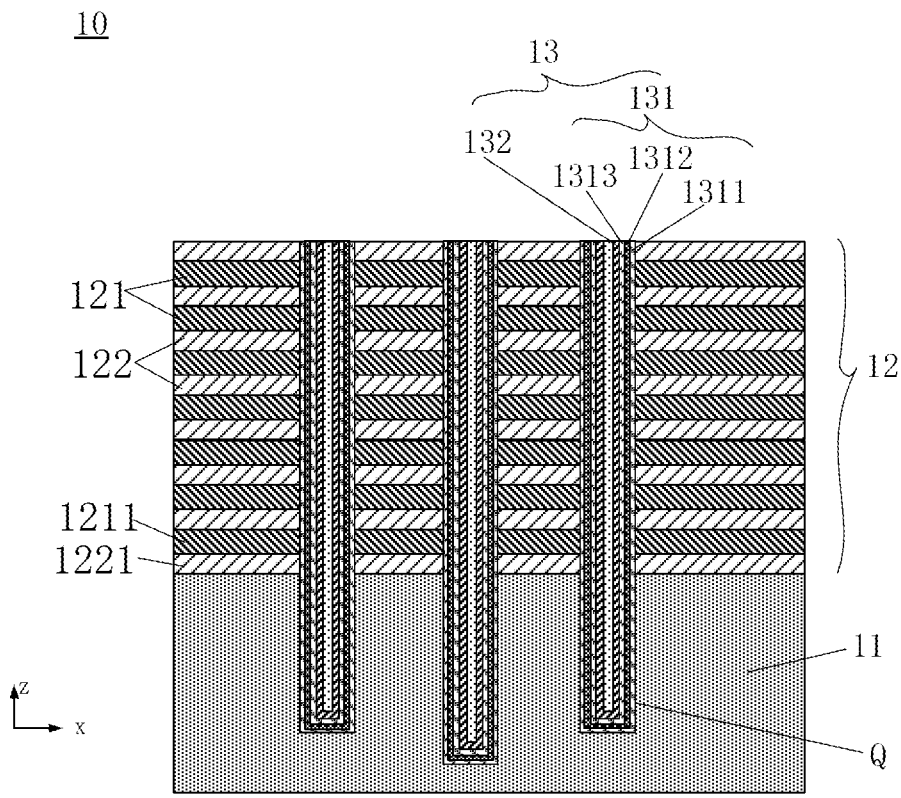
FIGS. 2a to 2h are cross-sectional structural schematic diagrams of a semiconductor structure provided by an implementation of the present disclosure under different process steps.

Referring to FIG. 2a, the stack direction can be taken as the z direction and a direction vertical to the stack direction as the x direction. The substrate 11 may include at least one of single crystal silicon (Si), single crystal germanium (Ge), III-V compound semiconductor materials, II-VI compound semiconductor materials, or other semiconductor materials known in the art.

The memory function layer 131 may include a barrier layer 1311, a charge capture layer 1312, and a tunneling oxide layer 1313. The materials of the barrier layer 1311, the charge capture layer 1312, the tunneling oxide layer 1313, and the channel layer 132 may be silicon oxide, silicon nitride, silicon oxide, and polysilicon, respectively, to form an "ONOP" structure, and the memory function layer 131 is an ONO film layer.

In some implementations, the above step S101 may include:
- forming a stack layer on the substrate 11, which includes a gate sacrificial layer and a gate spacer layer 122 arranged alternately;
- forming a memory channel structure 13 that penetrates through the stack layer along the stack direction z and extends into the substrate 11; and
- replacing the gate sacrificial layer with a gate structure 121 to obtain a stack structure 12.

The material of the gate sacrificial layer may include silicon nitride, and the material of the gate spacer layer 122 may include silicon oxide. The gate structure 121 mainly includes conductive materials, such as any one of tungsten, cobalt, copper, aluminum, doped crystalline silicon or silicide, or any of the combinations thereof. The gate structure 121 may include a bottom selective gate structure 1211, and the gate spacer layer 122 may include a bottom selective gate spacer layer 1221 which is between the substrate 11 and the bottom selective gate structure 1211 and is in direct contact with the substrate 11.

Step S102. Removing the substrate 11 and exposing the extension part Q.

Figure 2B:
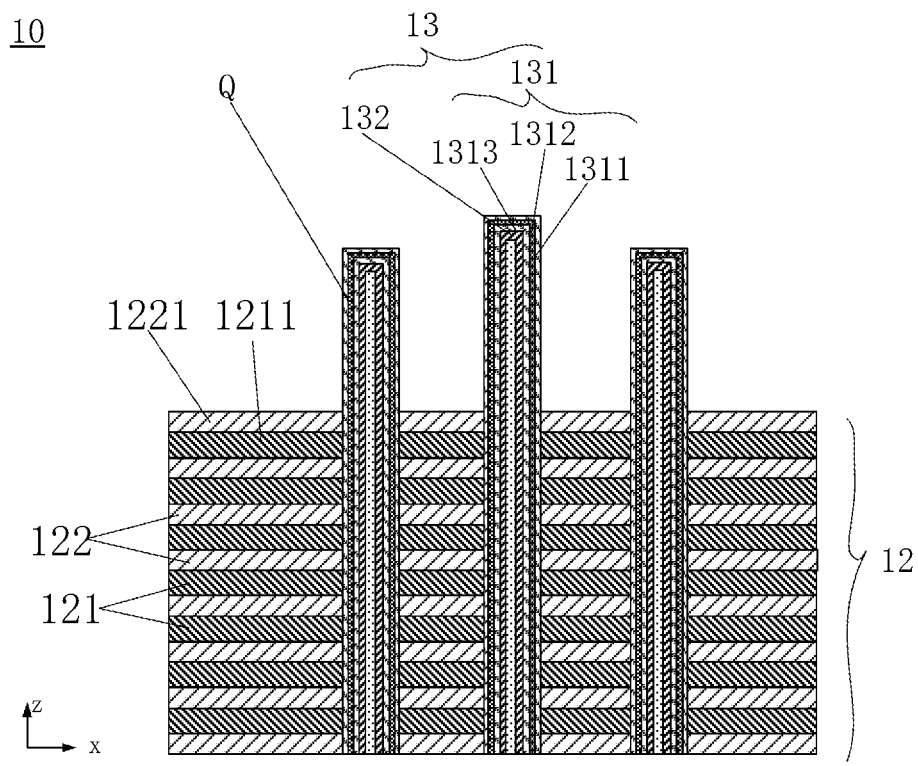

Referring to FIG. 2a and FIG. 2b, the substrate 11 can be removed by chemical mechanical polishing (CMP).

Step S103. Forming a sacrificial layer 14 on a side of the stack structure 12 where the substrate 11 is removed from, the sacrificial layer 14 wrapping a part of the exposed extension part Q.

Figure 2C:
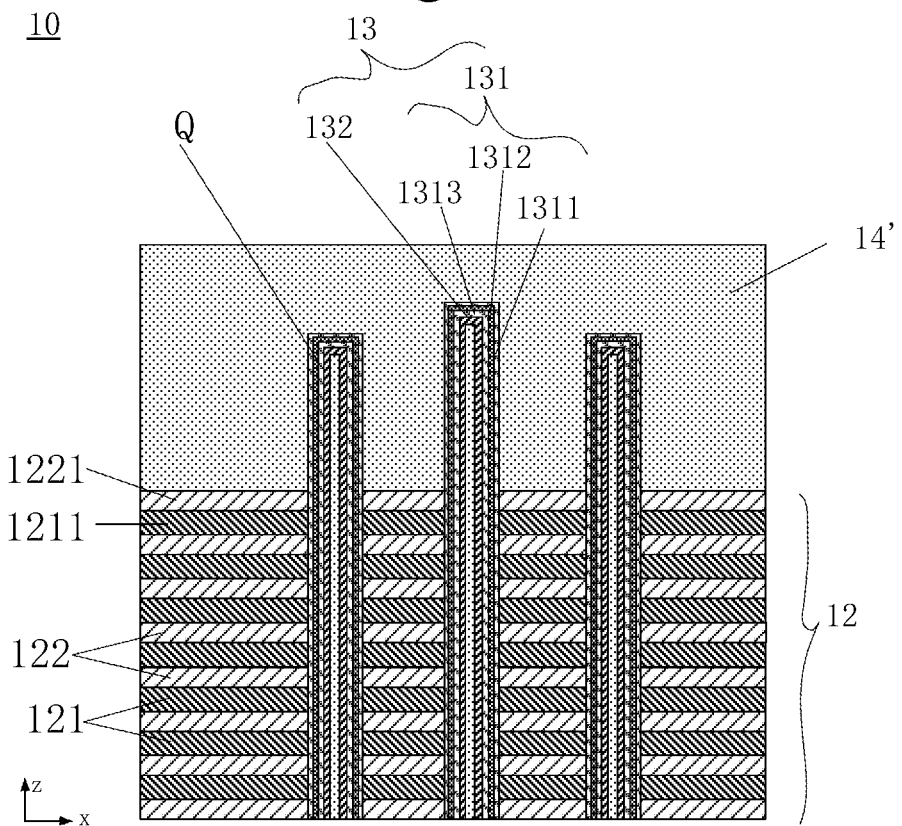
Figure 2D:
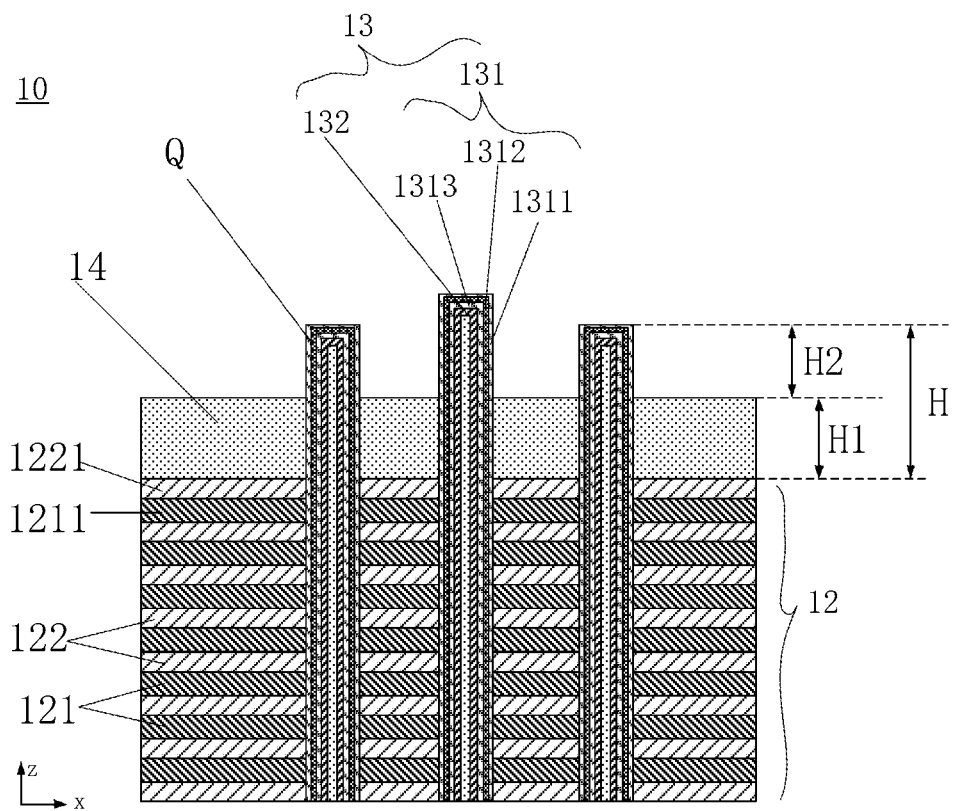

Referring to FIG. 2d, the material of the sacrificial layer 14 may include photoresist or suspended organic carbon (SOC).

In some implementations, the above step "forming a sacrificial layer 14 on a side of the stack structure 12 where the substrate 11 is removed from" can specifically include:
Forming an initial sacrificial layer 14' on a side of the stack structure 12 where the substrate 11 is removed from, the initial sacrificial layer 14' wrapping the exposed extension part Q.

The initial sacrificial layer 14' is etched back, and a part of the extension part Q is exposed to obtain the sacrificial layer 14.

Referring to FIG. 2c and FIG. 2d, the sacrificial layer 14 is obtained after back etching the initial sacrificial layer 14'. The initial sacrificial layer 14' may be formed on the substrate 11 using a film deposition process such as chemical vapor deposition (CVD), physical vapor deposition (PVD), atomic layer deposition (ALD), or any combination thereof. Back etching may include wet etching or dry etching.

It should be pointed out that the back etching only removes a certain thickness of the initial sacrificial layer 14' to expose a part of the extension part Q. For example, in the above FIG. 2d, if the extension part Q has an extension height H in the stack direction z and the sacrificial layer 14 obtained by back etching has a thickness H1 in the stack direction z, the extension height of the exposed extension part Q is H2, and the back etching depth can be controlled by controlling the back etching duration, and thus the magnitude of the extension height H2 can be controlled to avoid the height of the exposed extension part Q being too large.

Step S104. Removing the memory function layer 131 in the unwrapped extension part Q, and exposing the corresponding channel layer 132.

Figure 2E:
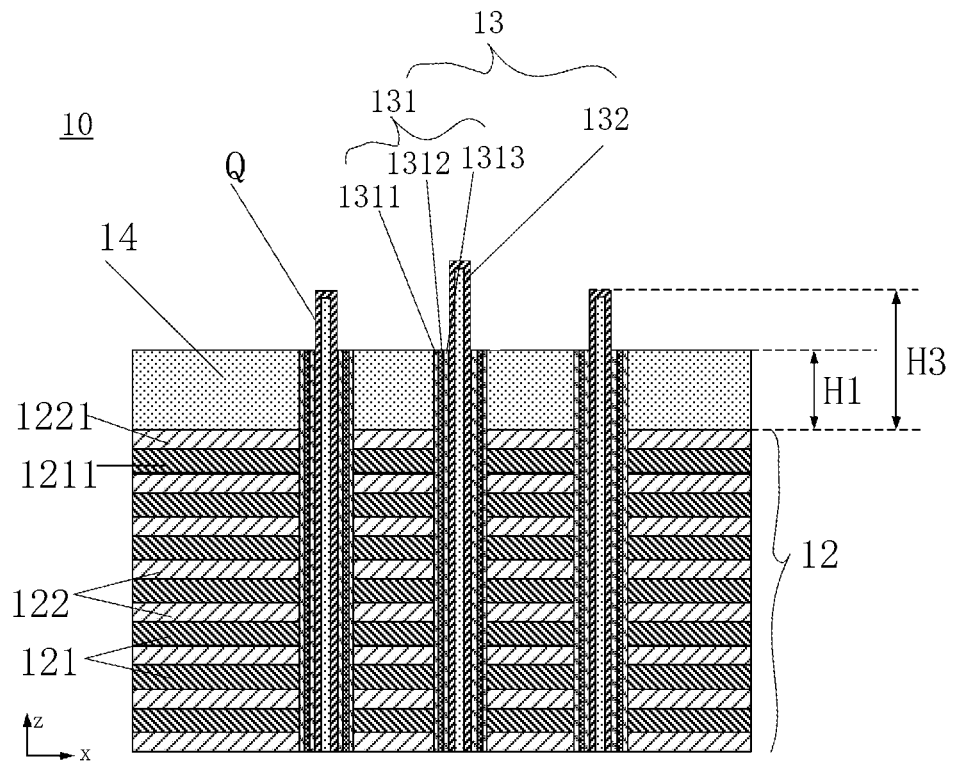

Referring to FIG. 2d and FIG. 2e, the unwrapped extension part Q is also the extension part Q corresponding to the extension height H2, and after the ONO film layer is removed, the channel layer 132 in the extension part Q has a first extension height H3 along the stack direction z, and the memory function layer 131 in the extension part Q has a second extension height H1 along the stack direction z.

Specifically, the memory function layer 131 (i.e., the ONO film layer) can be removed through a selective etching process. At this time, since the material of the sacrificial layer 14 is not oxide and nitride, it will not be affected. Therefore, during the removal of ONO, there is no risk of direct contact with the stack structure 12, and the bottom selection gate spacer layer 1221 in the stack structure 12 closest to the sacrificial layer 14 will not be damaged, for example, a part of the bottom selective gate spacer layer 1221 will not be etched away to result in its thickness thinning, thus avoiding that the subsequent common source structure (that is, the semiconductor layer 15 in FIG. 2g and FIG. 2h) and the bottom selective gate structure 1211 cannot be electrically isolated from each other because of the thin bottom selective gate spacer layer 1221.

Step S105. Removing the sacrificial layer 14 and exposing the remaining memory function layer 131 in the extension part Q.

Figure 2F:
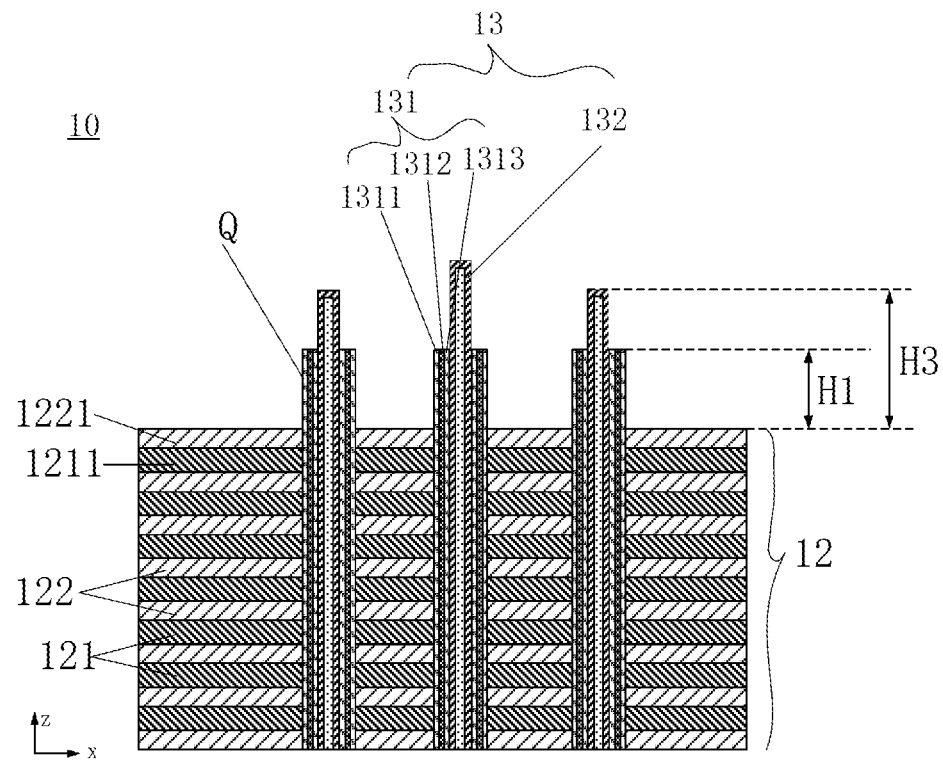

Referring to FIG. 2e and FIG. 2f, the sacrificial layer 14 can be removed by dry etching or wet etching, and since the material of the sacrificial layer 14 is not oxide, and is different from the materials of the gate spacer layer 122 and the ONO film layer (the memory function layer 131), the bottom selection gate spacer layer 1221 and the remaining ONO film layer in the extension part Q will not be affected in the course of removing the sacrificial layer 14, that is, in the course of removing the sacrificial layer 14, the original film thickness of the bottom selective gate spacer layer 1221 can be maintained as much as possible. And for the part of the memory channel structure 13 originally wrapped by the sacrificial layer 14 (that is, the part of the memory channel structure 13 corresponding to the second extension height H1), after the sacrificial layer 14 is removed, the original sectional width can also be maintained as much as possible, so as to avoid the phenomenon of the collapse or bending of the extension part Q due to the narrowing of the sectional width.

Figure 3A:
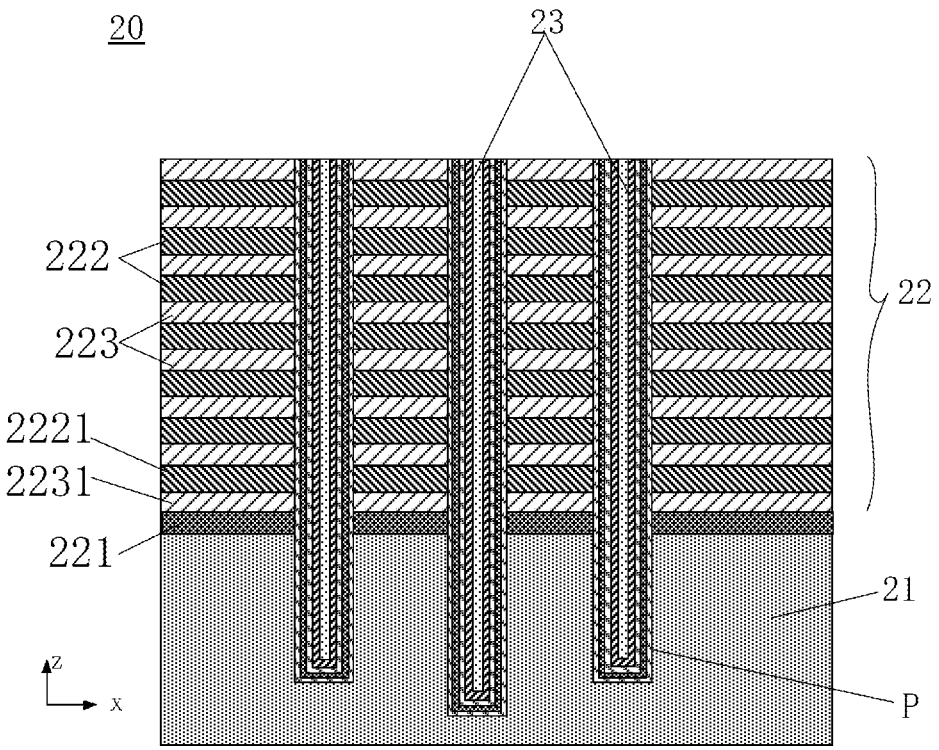
FIG. 3a to FIG. 3c are sectional structural schematic diagrams of another semiconductor structure provided by an implementation of the present disclosure under different process steps.
Figure 3B:
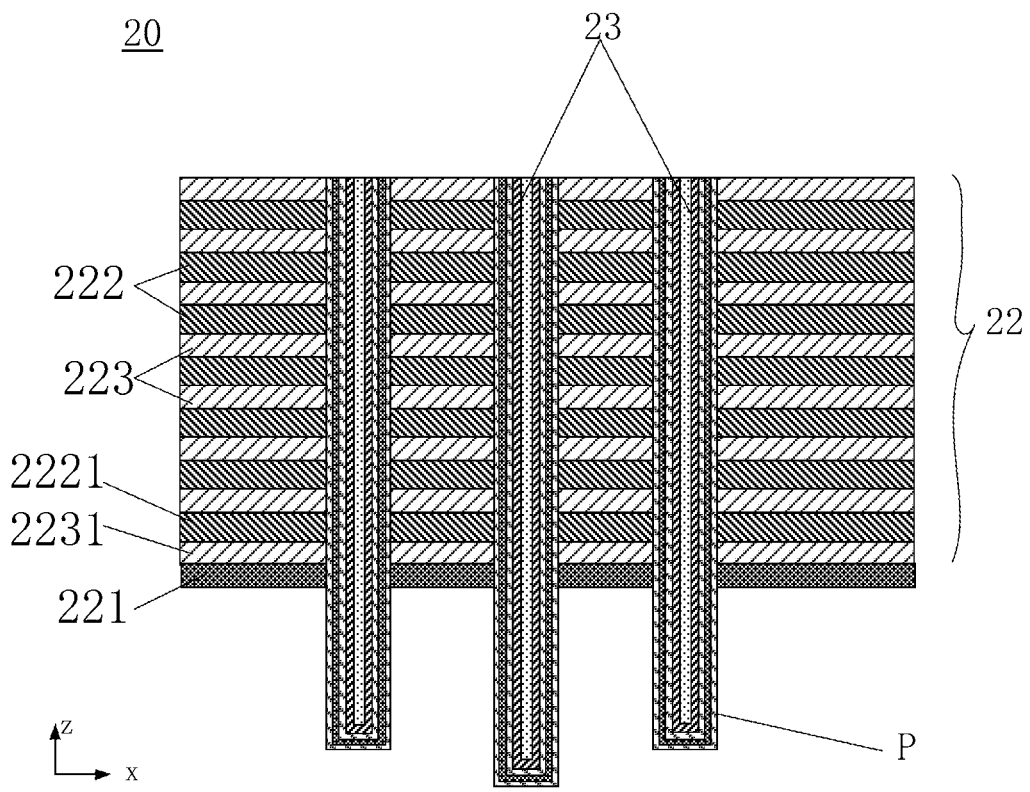
Figure 3C:
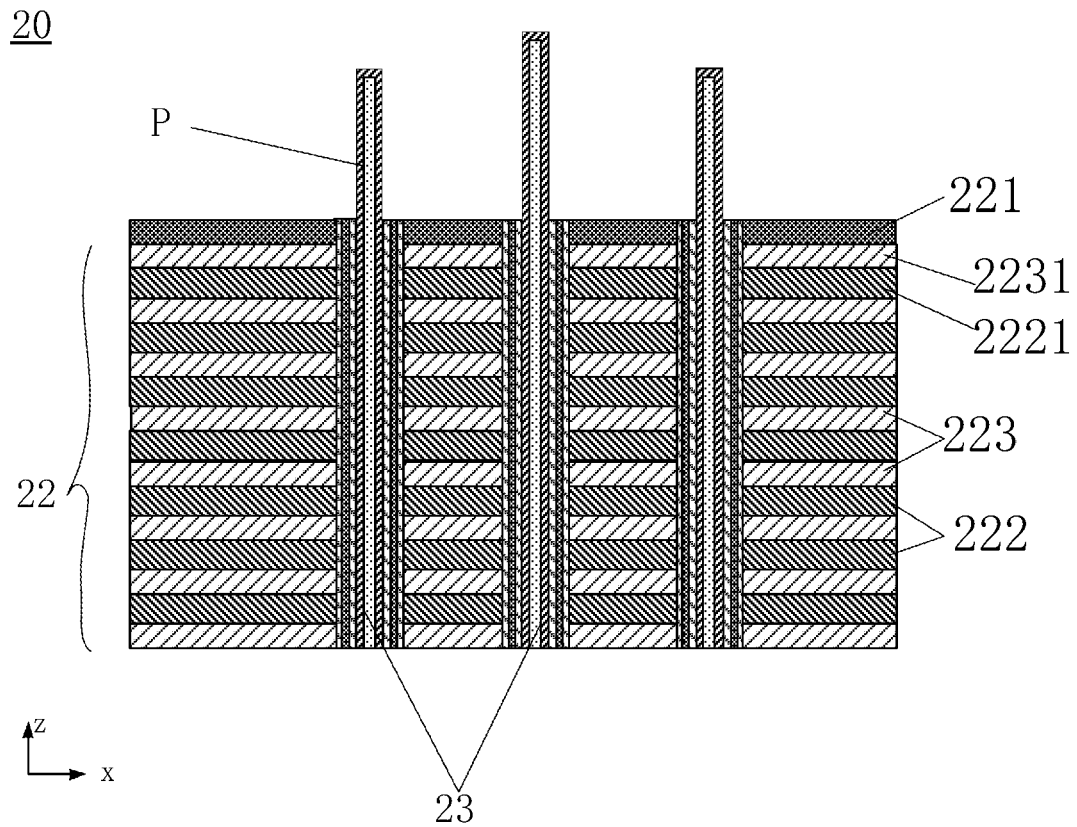

In other implementations, referring to FIGS. 3a to 3c, FIGS. 3a to 3c are cross-sectional structural schematic diagrams of another semiconductor structure 20 provided by an implementation of the present disclosure under different process steps. The semiconductor structure 20 includes a substrate 21, a stack structure 22 on the substrate 21, and a memory channel structure 23 penetrating through the stack structure 22 and extending into the substrate 21 to form an extension part P. The stack structure 22 includes a stop layer 221 on the substrate 21 and a gate structure 222 and a gate spacer layer 223 on the stop layer 221 and alternately arranged. The gate spacer layer 223 includes a bottom selective gate spacer layer 2231 on the stop layer, and the gate structure 222 includes a bottom selective gate structure 2221 on a side of the bottom selective gate spacer layer 2231 away from the stop layer 221.

When the substrate 21 is removed and the extension part P exposed by the memory channel structure 23 is ONO removed, since the gate spacer layer 223 is also an oxide, on the one hand, it is necessary to arrange an additional stop layer 221 to ensure that the bottom selection gate spacer layer 2231 will not be etched away together, resulting in its thickness thinning: on the other hand, with the increasing number of stack layers of the stack structure 22, when fabricating the memory channel structure 23, the extension depth of the memory channel structure 23 in the substrate 21 also gradually increases, that is, the height of the extension part P along the stack direction z gradually increases. At this time, considering that the sectional width of the extension part P will decrease when the ONO film is removed, the phenomenon that the extension part P bends or collapses will occur easily. Therefore, it is necessary to strictly control the height of the extension part P, that is, when fabricating the memory channel structure 23, it is necessary to strictly control the etching depth in the substrate 21, which has a high requirement to etching process.

And for the semiconductor structure 10 in the implementation of the present disclosure, by forming an initial sacrificial layer 14' after removing the substrate 11, and back etching the initial sacrificial layer 14' to expose a part of the extension part Q, thus, on the one hand, the exposed height of the extension part Q can be controlled by controlling the back etching time, without considering the depth of the memory channel structure 13 in the substrate 11, which reduces the control requirements to the etching process, and when removing the ONO film later, the phenomenon that the extension part Q bends or collapses will not occur, and on the other hand, when removing the sacrificial layer 14, because the material of the sacrificial layer 14 is different from those of the ONO film layer and the bottom selective gate spacer layer 1221, it will not damage the ONO film layer and the bottom selective gate spacer layer 1221, and can maintain the original film thickness of the bottom selective gate spacer layer 1221 as much as possible.

Step S106. Forming a semiconductor layer 15 on a side of the stack structure 12 where the sacrificial layer 14 is removed from, the semiconductor layer 15 wrapping the channel layer 132 and the memory function layer 131 exposed in the extension part Q.

Figure 2G:
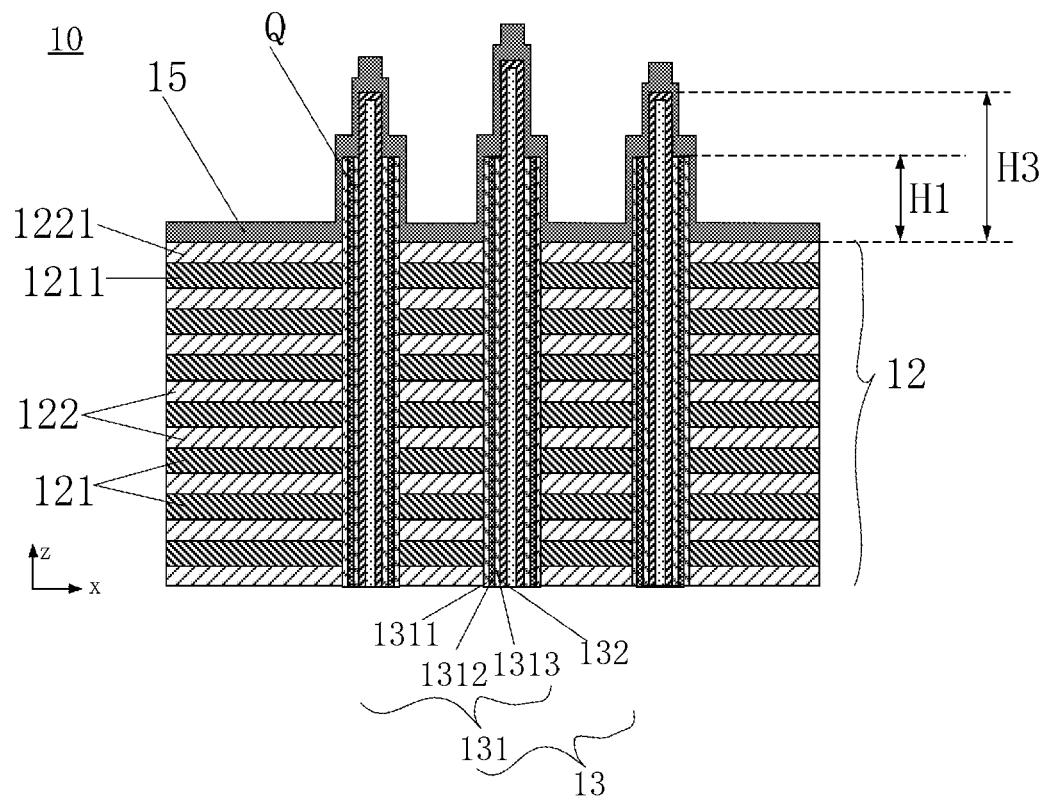
Figure 2G:
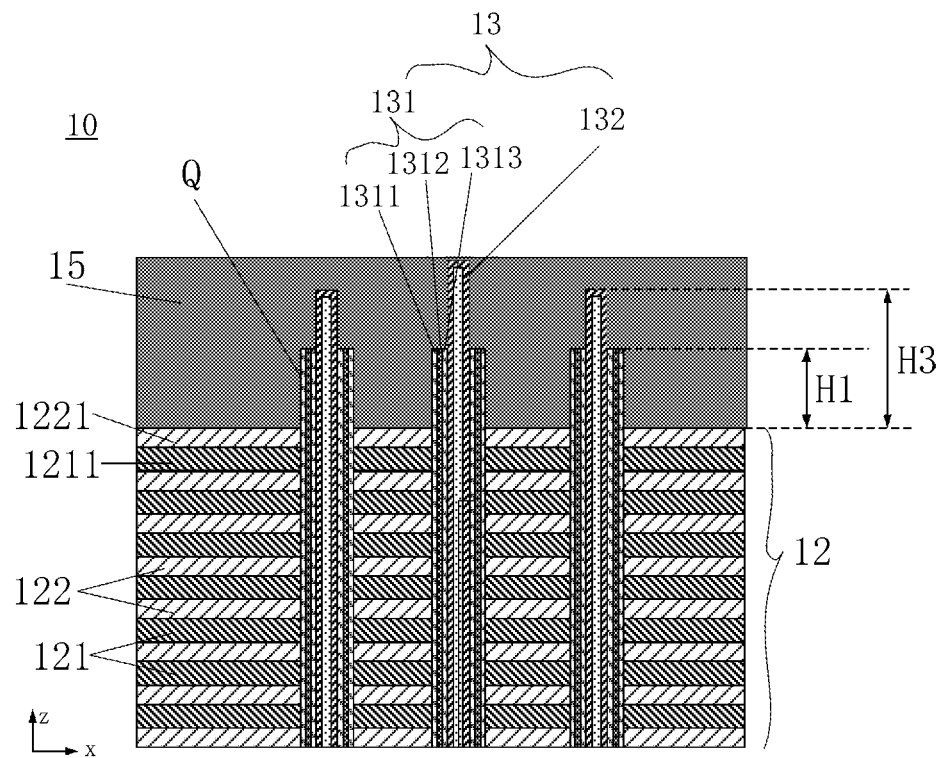

Referring to FIG. 2g and FIG. 2g', the material of the semiconductor layer 15 may include polysilicon, and the semiconductor layer 15 may be formed by a thin film deposition process such as CVD, PVD, ALD, or any combination thereof. The semiconductor layer 15 can be fabricated as a non-flat layer with a relatively thin thickness to save the fabrication cost as much as possible, for example, referring to FIG. 2g. The semiconductor layer 15 can also be fabricated as a flat layer, for example, referring to FIG. 2g'.

It should be noted that the semiconductor layer 15 is in direct contact with the channel layer 132 in the extension part Q, and the semiconductor layer 15 is generally used as a common source structure. And since a part of the memory function layer 131 in the extension part Q has been removed in the ONO removal process, but the channel layer 132 is not affected, the channel layer 132 in the extension part Q has a first extension height H3 along the stack direction z and the memory function layer 131 in the extension part Q has a second extension height H1 along the stack direction z.

In some implementations, after the semiconductor layer 15 is formed on a side of the stack structure 12 where the sacrificial layer 14 is removed from, the fabrication method may further include:
 forming an insulating layer 16 on the semiconductor layer 15; and
 forming, in the insulating layer 16, a source contact 17 connected with the semiconductor layer 15, the source contact 17 being electrically connected with an external circuit.

The material of the insulating layer 16 may include oxides such as silicon oxide. The material of the source contact 17 mainly includes conductive materials, such as at least one of tungsten, cobalt, copper, aluminum, etc. The source contact 17 can be formed in the insulating layer 16 through the through silicon via (TSV) technology. Through the source contact 17 and the semiconductor layer 15, an electrical connection can be realized between an external circuit and the memory channel structure 13, and the external circuit can be a source circuit.

Based on the fabrication method of the semiconductor structure 10 provided by the above implementation, the implementation of the present disclosure also provides a semiconductor structure 10.

Figure 2H:
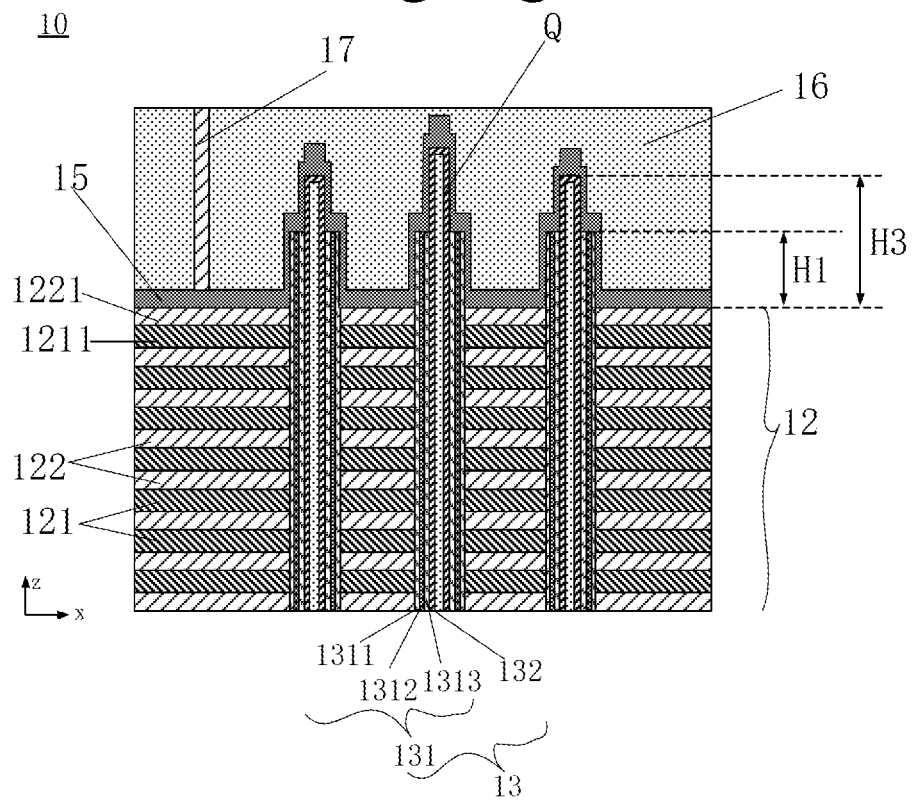

FIG. 2h is a cross-sectional structural schematic diagram of a semiconductor structure 10 provided by an implementation of the present disclosure. The semiconductor structure 10 includes a stack structure 12, a memory channel structure 13, and a semiconductor layer 15. The stack structure 12 includes a gate structure 121 and a gate spacer layer 122 alternately arranged. The memory channel structure 13 penetrates through the stack structure 12 along the stack direction z and protrudes out of the stack structure 12 to form an extension part Q. The memory channel structure 13 includes a memory function layer 131 and a channel layer 132. The semiconductor layer 15 is on a side of the stack structure 12 close to the extension part Q and wraps the end face of the extension part Q and a side of the memory function layer 131 and a side of the channel layer 132 in the extension part Q.

The material of the semiconductor layer 15 may include polysilicon, and the material of the gate spacer layer 122 may include silicon oxide. The gate structure 121 mainly includes conductive materials, such as any one of tungsten, cobalt, copper, aluminum, doped crystalline silicon or silicide or any combination thereof.

The gate structure 121 may include a bottom selective gate structure 1211. The gate spacer layer 122 may include a bottom selective gate spacer layer 1221, and is between the semiconductor layer 15 and the bottom selective gate structure 1211 and is in direct contact with the semiconductor layer 15.

The memory function layer 131 may include a barrier layer 1311, a charge capture layer 1312, and a tunneling oxide layer 1313. The materials of the barrier layer 1311, the charge capture layer 1312, the tunneling oxide layer 1313, and the channel layer 132 may be silicon oxide, silicon nitride, silicon oxide, and polysilicon, respectively, to form an "ONOP" structure, and the memory function layer 131 is an ONO film layer.

In some implementations, the channel layer 132 in the extension part Q has a first extension height H3 along the stack direction z, the memory function layer 131 in the extension part Q has a second extension height H1 along the stack direction z, and the first extension height H3 is greater than the second extension height H1.

In some implementations, the semiconductor structure 10 further includes:
 an insulating layer 16 on a side of the semiconductor layer 15 away from the stack structure 12; and
 a source contact 17 in the insulating layer 16 and connected with the semiconductor layer 15, the source contact 17 being electrically connected with an external circuit.

The material of the insulating layer 16 may include oxides such as silicon oxide. The material of the source contact 17 mainly includes conductive materials, such as at least one of tungsten, cobalt, copper, aluminum, etc. Through the source contact 17 and the semiconductor layer 15, an electrical connection can be realized between an external circuit and the memory channel structure 13, and the external circuit can be a source circuit.

It should be understood that the structure and fabrication process of each component of the semiconductor structure 10 in the implementation of the present disclosure can refer to the above implementations of the fabrication method of the semiconductor structure 10, and will not be repeated here.

As can be seen from the above, for the semiconductor structure 10 and its fabrication method provided by the implementations of the present disclosure, the phenomenon of the local collapse or bending of the memory channel structure 13 can be avoided when the memory function layer 131 is removed, and the thickness of the bottom selection gate spacer layer 1221 can be protected without arranging a stop layer. The fabrication method is simple and has a strong practicability, by: forming a stack structure 12 and a memory channel structure 13 on the substrate 11, the memory channel structure 13 penetrating through the stack structure 12 along the stack direction z and extending into the substrate 11 to form an extension part Q, the memory channel structure 13 including a memory function layer 131 and a channel layer 132; then, removing the substrate 11 and exposing the extension part Q, and forming a sacrificial layer 14 on a side of the stack structure 12 where the substrate 11 is removed from, the sacrificial layer 14 wrapping a part of the exposed extension part Q; then, removing the memory function layer 131 in the unwrapped extension part Q and exposing the corresponding channel layer 132; then, removing the sacrificial layer 14 and exposing the remaining memory function layer 131 in the extension part Q; and then, forming a semiconductor layer 15 on a side of the stack structure 12 where the sacrificial layer 14 is removed from, the semiconductor layer 15 wrapping the channel layer 132 and the memory function layer 131 exposed in the extension part Q.

In addition, the implementations of the present disclosure also provides a memory, which includes a semiconductor structure described in any of the above implementations and a peripheral circuit structure. The peripheral circuit structure is bonded with the stack structure on a side of the stack structure away from the semiconductor layer, so that the peripheral circuit structure and the semiconductor structure are electrically connected.

Figure 4:
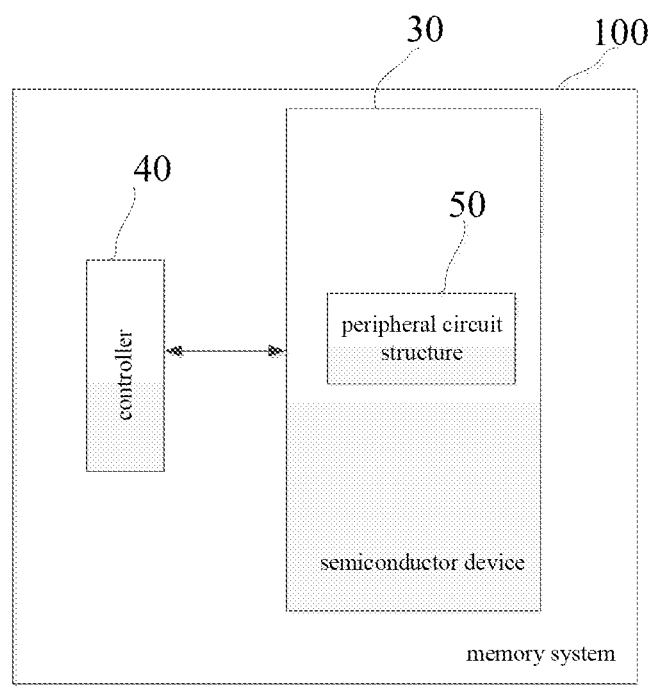
FIG. 4 is a structural schematic diagram of a memory system provided by an implementation of the present disclosure.

In addition, referring to FIG. 4, the implementations of the present disclosure also provides a memory system 100, which includes at least any one memory 30 described above and a controller 40 coupled with the memory 30, the controller 40 is used to control the memory 30 to perform data writing and reading operations. The controller 40 is also connected with an external host. The external host can transmit user instructions and store data to the controller 40. The user instructions can include writing instructions, erasing instructions and reading instructions. The controller 40 can determine which store location in the memory 30 to write, erase and read according to these contents.

The peripheral circuit structure 50 may be configured to perform operations such as reading, writing, erasing, and verifying on the memory unit in the memory channel structure, and the peripheral circuit structure 50 may include a word line driver, a bit line driver, a column decoder, a sensing circuit, a data buffer, a program verification logic, an erase verification circuit, and the like, which may perform the above operations according to the acquired computer program instructions.

In the example of the present disclosure, the memory 30 is not limited to a three-dimensional NAND memory. Without violating the disclosure or teaching of the present disclosure, the memory 30 can be implemented as various other types of non-volatile memories that can maintain the stored data when the power supply is disconnected.

The above are only preferred implementations of the present disclosure and are not intended to limit the present disclosure. Any modification, equivalent replacement and improvement made within the spirit and principles of the present disclosure should be included in the scope of protection of the present disclosure.

What is claimed is:

1. A semiconductor structure, comprising:
a stack structure including a gate structure and a gate spacer layer arranged alternately;
a memory channel structure penetrating through the stack structure along a stack direction and protruding out of the stack structure to form an extension part, the memory channel structure including a memory function layer and a channel layer; and
a semiconductor layer which is on a side of the stack structure close to the extension part and wraps an end face of the extension part, and a side of the memory function layer and a side of the channel layer in the extension part.

2. The semiconductor structure according to claim 1, wherein the channel layer in the extension part has a first extension height along the stack direction, the memory function layer in the extension part has a second extension height along the stack direction, and the first extension height is greater than the second extension height.

3. The semiconductor structure according to claim 1, further comprising:
an insulating layer on a side of the semiconductor layer away from the stack structure;
a source contact in the insulating layer and connected with the semiconductor layer, the source contact being electrically connected with an external circuit.

4. A memory system, comprising at least one memory and a controller coupled with the memory, wherein the controller is used to control the memory to store data,
the at least one memory includes a semiconductor structure and a peripheral circuit structure, the semiconducter structure including a stack structure, a memory channel structure, and a semiconductor layer,
the stack structure includes a gate structure and a gate spacer layer arranged alternately,
the memory channel structure penetrates through the stack structure along a stack direction and protrudes out of the stack structure to form an extension part, the memory channel structure including a memory function layer and a channel layer,
the semiconductor layer is on a side of the stack structure close to the extension part and wraps an end face of the extension part, and a side of the memory function layer and a side of the channel layer in the extension part, and
the peripheral circuit structure is bonded with the stack structure on a side of the stack structure away from the semiconductor layer, so that the peripheral circuit structure is electrically connected with the semiconductor structure.

* * * * *